(12) United States Patent
Liu et al.

(10) Patent No.: US 12,066,477 B2
(45) Date of Patent: *Aug. 20, 2024

(54) METHOD AND DEVICE FOR CALCULATING DIRECTIONAL PATTERN OF BEAM POINTING ADJUSTABLE ANTENNA

(71) Applicant: KUANG-CHI INSTITUTE OF ADVANCED TECHNOLOGY, Shenzhen (CN)

(72) Inventors: RuoPeng Liu, Shenzhen (CN); Zhiya Zhao, Shenzhen (CN); Hua Tian, Shenzhen (CN)

(73) Assignee: KUANG-CHI INSTITUTE OF ADVANCED TECHNOLOGY, Guangdong (CN)

( * ) Notice: Subject to any disclaimer, the term of this patent is extended or adjusted under 35 U.S.C. 154(b) by 703 days.

This patent is subject to a terminal disclaimer.

(21) Appl. No.: 17/053,995

(22) PCT Filed: Dec. 28, 2018

(86) PCT No.: PCT/CN2018/124556
§ 371 (c)(1),
(2) Date: Nov. 9, 2020

(87) PCT Pub. No.: WO2019/214257
PCT Pub. Date: Nov. 14, 2019

(65) Prior Publication Data
US 2021/0270883 A1    Sep. 2, 2021

(30) Foreign Application Priority Data

May 8, 2018 (CN) .......................... 201810431413.3

(51) Int. Cl.
G01R 29/10    (2006.01)
G01R 29/08    (2006.01)
(Continued)

(52) U.S. Cl.
CPC ......... *G01R 29/10* (2013.01); *G01R 29/0878* (2013.01); *G01S 1/028* (2013.01);
(Continued)

(58) Field of Classification Search
CPC ...... H01Q 21/29; H01Q 21/0043; H01Q 3/24; H04B 17/3913; H04B 1/72;
(Continued)

(56) References Cited

U.S. PATENT DOCUMENTS

2003/0016180 A1* 1/2003 James .................... H01Q 13/20
343/770
2011/0151596 A1* 6/2011 Cho ...................... G01R 35/007
257/E21.529

(Continued)

FOREIGN PATENT DOCUMENTS

CN    101930495 A    12/2010
CN    102820542 A    12/2012
(Continued)

OTHER PUBLICATIONS

International Search Report for corresponding PCT/CN2018/124556 mailed Mar. 14, 2019, 2 Pages.
(Continued)

*Primary Examiner* — Eman A Alkafawi
*Assistant Examiner* — Suresh K Rajaputra
(74) *Attorney, Agent, or Firm* — Armstrong Teasdale LLP

(57) ABSTRACT

Provided are a directional pattern calculation method and apparatus for a beam pointing adjustable antenna. In the design method, key control factors are quantized, for example, a arrangement and combination modes for a plu-
(Continued)

rality of slot units and wave-controlled codes for conducting and cut-off states of a slot unit, and different combinations of slot units and a far-field directional pattern of a controlled array antenna are evaluated, so that electrical performance indicators of the array antenna can be further evaluated. Weighting calculation is implemented for a directional pattern of a beam pointing adjustable antenna. Key information such as a form of a slot unit and a arrangement and combination modes for slot units can be globally optimized.

14 Claims, 7 Drawing Sheets

(51) Int. Cl.
    *G01S 1/02*         (2010.01)
    *G01S 3/02*         (2006.01)
    *H04B 1/72*         (2006.01)
    *H04B 7/06*         (2006.01)
    *H04B 17/391*     (2015.01)

(52) U.S. Cl.
    CPC ............... *G01S 3/026* (2013.01); *H04B 1/72* (2013.01); *H04B 7/063* (2013.01); *H04B 17/3912* (2015.01); *H04B 17/3913* (2015.01)

(58) Field of Classification Search
    CPC ............... H04B 17/3912; H04B 7/063; G01R 29/0878; G01R 29/10; G01S 3/026; G01S 1/028; G06F 30/367
    See application file for complete search history.

(56) References Cited

U.S. PATENT DOCUMENTS

| | | | |
|---|---|---|---|
| 2012/0212375 A1 | 8/2012 | Depree, IV | |
| 2013/0241785 A1* | 9/2013 | De Flaviis | H01Q 13/10 343/793 |
| 2021/0242600 A1* | 8/2021 | Liu | H01Q 3/267 |

FOREIGN PATENT DOCUMENTS

| | | |
|---|---|---|
| CN | 103412970 A | 11/2013 |
| CN | 105184002 A | 12/2015 |
| WO | 2004059876 A1 | 7/2004 |
| WO | 2015016331 A1 | 2/2015 |

OTHER PUBLICATIONS

Extended European Search Report for corresponding European Patent App. No. 18918306.4, dated Dec. 20, 2021, 14 pages.
Grbic A et al. "Leaky CPW-Based Slot Antenna Arrays for Millimeter-Wave Applications," IEEE Transactions on Antennas and Propagation, IEEE, USA, 50 (11), Nov. 1, 2002.
Christopher Caloz et al. "CRLB metamaterial leaky-wave and resonant antennas," IEEE Antennas and Propagation Magazine, IEEE Service Center, Piscataway, NJ, US, 50 (5), Oct. 1, 2008.
Majid Huda A et al. "Frequency and Pattern Reconfigurable Slot Antenna," IEEE Transactions on Antennas and Propagation, IEEE, USA, 62 (10), Oct. 1, 2014.
Nguyen-Trong Nghia et al. "Transmission-Line Model of Nonuniform Leaky-Wave Antennas," IEEE Transactions on Antennas and Propagation, IEEE, USA, 64 (3), Mar. 1, 2016.
Cheng Jin et al. "Leaky-Wave Radiation Behavior From a Double Periodic Composite Right/Left-Handed Substrate Integrated Waveguide," IEEE Transactions on Antennas and Propagation, IEEE, USA, 60 (4), Apr. 1, 2012.

* cited by examiner

METHOD AND DEVICE FOR CALCULATING DIRECTIONAL PATTERN OF BEAM POINTING ADJUSTABLE ANTENNA

CROSS-REFERENCE TO RELATED APPLICATIONS

The disclosure is a national stage application of International Patent Application No. PCT/CN2018/124556, filed on Dec. 28, 2018, which claims the benefit of priority to Chinese Patent Application No. 201810431413.3, filed on May 8, 2018, the contents and disclosure of each of which are hereby incorporated by reference in their entirety.

TECHNICAL FIELD

The present disclosure relates to the technical field of antennas, and specifically, to a method and device for calculating the directional pattern of an beam pointing adjustable antenna.

BACKGROUND

A waveguide-based beam pointing adjustable antenna (leaky-wave antenna) has advantages of low costs, long life, low profile, full shielding to eliminate complex internal scattering. Key factors for designing the beam pointing adjustable antenna includes: slot unit, slot spacing, slot arrangement, slot on and off control, etc. Among them, in order to achieve precise regulation of specific beam directions and low side-lobe control in a working frequency band, linkage optimization of the above-mentioned key factors is required.

A conventional design method for a beam pointing adjustable antenna having regular slots is relatively mature, factors such as slot size and spacing are related to directional pattern formed by the antenna, and the form is relatively intuitive. However, it does not have turning-on or cutting-off function, and cannot achieve beam pointing deflection.

A design method for a beam pointing adjustable antenna having irregular slots greatly depends on simulation software, global optimization takes a relatively long time, which is difficult for engineering applications.

For a beam-adjustable system, the principle of phased arrays is usually used for reference, and the array elements are the same. However, the beam control of the system is implemented through precise phase modulation of each array element. Compared with the beam pointing adjustable antenna having a plurality of slot units, the control mechanism is different. For the beam pointing adjustable antenna, it is difficult to provide guidance for turning-on or cutting-off each slot unit.

For the prior-art problems that beam pointing and deflection cannot be achieved, dependency on the simulation software is large, and it is difficult to provide guidance for turning-on or cutting-off each slot unit according to the phased array principle, no effective solution have been proposed.

SUMMARY

For the foregoing prior-art problems, the present disclosure provides a method and device for calculating directional pattern of a beam pointing adjustable antenna, which can realize the weighted calculation of directional pattern of the beam pointing adjustable antenna without depending on simulation software, at the same time, various key parameters can be globally optimized, so as to realize the fast beam switching.

The technical solutions in the present disclosure are implemented as follows:

According to one aspect of the present disclosure, a method for calculating directional pattern of a beam pointing adjustable antenna is provided, the beam pointing adjustable antenna comprises a plurality of slot units that generate leaky waves, and the method comprises the following steps:

S1. obtaining a total transmission matrix of a single-slot waveguide and a transmission matrix of a seamless waveguide corresponding to one of the slot units, and obtaining an equivalent transmission matrix of the single slot unit according to the total transmission matrix of the single-slot waveguide and the transmission matrix of the seamless waveguide;

S2. obtaining an arrangement and combination mode of the slot units and a beam pointing control code representing on or off state of each slot unit, and obtaining a transmission matrix cascading mode of the beam pointing adjustable antenna according to the arrangement and combination mode, the beam pointing control code, and the equivalent transmission matrix of the single slot unit; and S3. obtaining the directional pattern of the single-slot waveguide structure excited at the left end and the directional pattern of the single-slot waveguide structure excited at the right end, and obtaining a composite directional pattern of the beam pointing adjustable antenna according to the directional pattern of the single-slot waveguide structure excited at the left end, the directional pattern of the single-slot waveguide structure excited at the right end, and the transmission matrix cascading mode of the beam pointing adjustable antenna.

In one embodiment, the arrangement and combination mode of the slot unit in the step S2 comprises a spacing between the slot units, a form of the slot unit, or a combination of them.

In one embodiment, obtaining the total transmission matrix of the single-slot waveguide corresponding to one of the slot units in above step S1 comprises:

simulating the single-slot waveguide to obtain a total scattering parameter of the single-slot waveguide; and
obtaining the total transmission matrix of the single-slot waveguide according to the total scattering parameter of the single-slot waveguide.

In one embodiment, wherein obtaining the transmission matrix of the seamless waveguide in above step S1 comprises:

obtaining a simulation model of the seamless waveguide: and
performing electromagnetic simulation on the simulation model of the seamless waveguide to obtain the transmission matrix of the seamless waveguide: or
obtaining the transmission matrix of the seamless waveguide in the step S1 comprises:
obtaining an equivalent transmission line model of the seamless waveguide: and
performing calculation according to the equivalent transmission line model of the seamless waveguide and transmission line matrix theory to obtain the transmission matrix of the seamless waveguide.

In one embodiment, the above step S3 specifically comprises:
  obtaining an equivalent input-to-output ratio of the single slot unit according to a transmission matrix of the beam pointing adjustable antenna:
  obtaining the directional pattern of the single-slot waveguide excited at the left end and the directional pattern of the single-slot waveguide excited at the right end; and
  obtaining the composite directional pattern according to the directional pattern of the single-slot waveguide excited at the left end, the directional pattern of the single-slot waveguide excited at the right end, and the equivalent input-to-output ratio of the single slot unit.

In one embodiment, the beam pointing adjustable antenna is a one-dimensional or two-dimensional array structure.

According to another aspect of the present disclosure, a device for calculating directional pattern of a beam pointing adjustable antenna is provided, the device comprises:
  a slot transmission matrix obtaining module configured for: obtaining a total transmission matrix of a single-slot waveguide and a transmission matrix of a seamless waveguide corresponding to one of the slot units, and obtaining an equivalent transmission matrix of the single slot unit according to the total transmission matrix of the single-slot waveguide and the transmission matrix of the seamless waveguide:
  an antenna transmission matrix obtaining module configured for: obtaining an arrangement and combination mode of the slot units and a beam pointing control code representing on or off state of each slot unit, and obtaining a transmission matrix cascading mode of the beam pointing adjustable antenna according to the arrangement and combination mode, the beam pointing control code, and the equivalent transmission matrix of the single slot unit; and
  an antenna directional pattern generating module, configured for: obtaining the directional pattern of the single-slot waveguide structure excited at the left end and the directional pattern of the single-slot waveguide structure excited at the right end, and obtaining a composite directional pattern of the beam pointing adjustable antenna according to the directional pattern of the single-slot waveguide structure excited at the left end, the directional pattern of the single-slot waveguide structure excited at the right end, and the transmission matrix cascading mode of the beam pointing adjustable antenna.

In one embodiment, the slot transmission matrix obtaining module comprises:
  a single-slot waveguide simulating submodule configured for: simulating the single-slot waveguide to obtain a total scattering parameter of the single-slot waveguide: and
  a single-slot waveguide transmission matrix obtaining submodule configured for: obtaining the total transmission matrix of the single-slot waveguide according to the total scattering parameter of the single-slot waveguide;
  wherein the single-slot waveguide simulating submodule and the single-slot waveguide transmission matrix obtaining submodule are sequentially connected.

In one embodiment, the slot transmission matrix obtaining module comprises following sequentially connected submodules:
  a seamless waveguide simulating submodule configured for: obtaining a simulation model of the seamless waveguide; and
  a first seamless waveguide transmission matrix obtaining submodule configured for: performing electromagnetic simulation on the simulation model of the seamless waveguide to obtain the transmission matrix of the seamless waveguide; or
  the slot transmission matrix obtaining module comprises following sequentially connected submodules:
  a seamless waveguide equivalence submodule configured for: obtaining an equivalent transmission line model of the seamless waveguide; and
  a second seamless waveguide transmission matrix obtaining submodule configured for: performing calculation according to the equivalent transmission line model of the seamless waveguide and transmission line matrix theory to obtain the transmission matrix of the seamless waveguide.

In one embodiment, the antenna directional pattern generating module comprises following sequentially connected submodules:
  an equivalent input to output ratio obtaining submodule, configured for: obtaining an equivalent input-to-output ratio of the single slot unit according to a transmission matrix of the beam pointing adjustable antenna;
  a single-slot waveguide directional pattern obtaining submodule configured for: obtaining the directional pattern of the single-slot waveguide excited at the left end and the directional pattern of the single-slot waveguide excited at the right end; and
  an antenna directional pattern generating submodule, configured for: obtaining the composite directional pattern according to the directional pattern of the single-slot waveguide excited at the left end, the directional pattern of the single-slot waveguide excited at the right end, and the equivalent input-to-output ratio of the single slot unit.

The present disclosure quantifies key control factors, for example, arrangement and combination mode of the slot units, a spacing between slot units, and beam pointing control code representing on or off state of the slot unit, and different combinations of slot units and a far-field directional pattern of the beam pointing adjustable antenna are evaluated, such that electrical performance indicators of the beam pointing adjustable antenna can be further evaluated. Therefore, the weighted calculation of directional pattern of the beam pointing adjustable antenna is realized, and key information including a form of the slot unit and arrangement and combination mode of the slot units can be globally optimized. Which greatly saves the optimization of slot unit selection, arrangement, combination, and spacing during antenna design, so as to focus on structural form of the slot unit. In addition, according to the beam pointing and deflection requirement, the corresponding beam pointing control code representing on or off state of each slot unit may be further calculated, so as to provide guidance for the regulation of the beam pointing and achieve fast beam shaping and switching.

BRIEF DESCRIPTION OF DRAWINGS

To describe the technical solutions in the embodiments of the present disclosure or in the prior art more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 5 (*b*) is a schematic diagram of a far-field simulation result of a simulated single-slot waveguide under right-port excitation:

FIG. 5 (*c*) is a schematic diagram of a far-field simulation result of a simulated single-slot waveguide under dual-port excitation:

DESCRIPTION OF EMBODIMENTS

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art according to the embodiments of the present disclosure shall fall within the protection scope of the present disclosure.

According to an embodiment of the present disclosure, a method for calculating directional pattern of a beam pointing adjustable antenna is provided.

Figure 1:
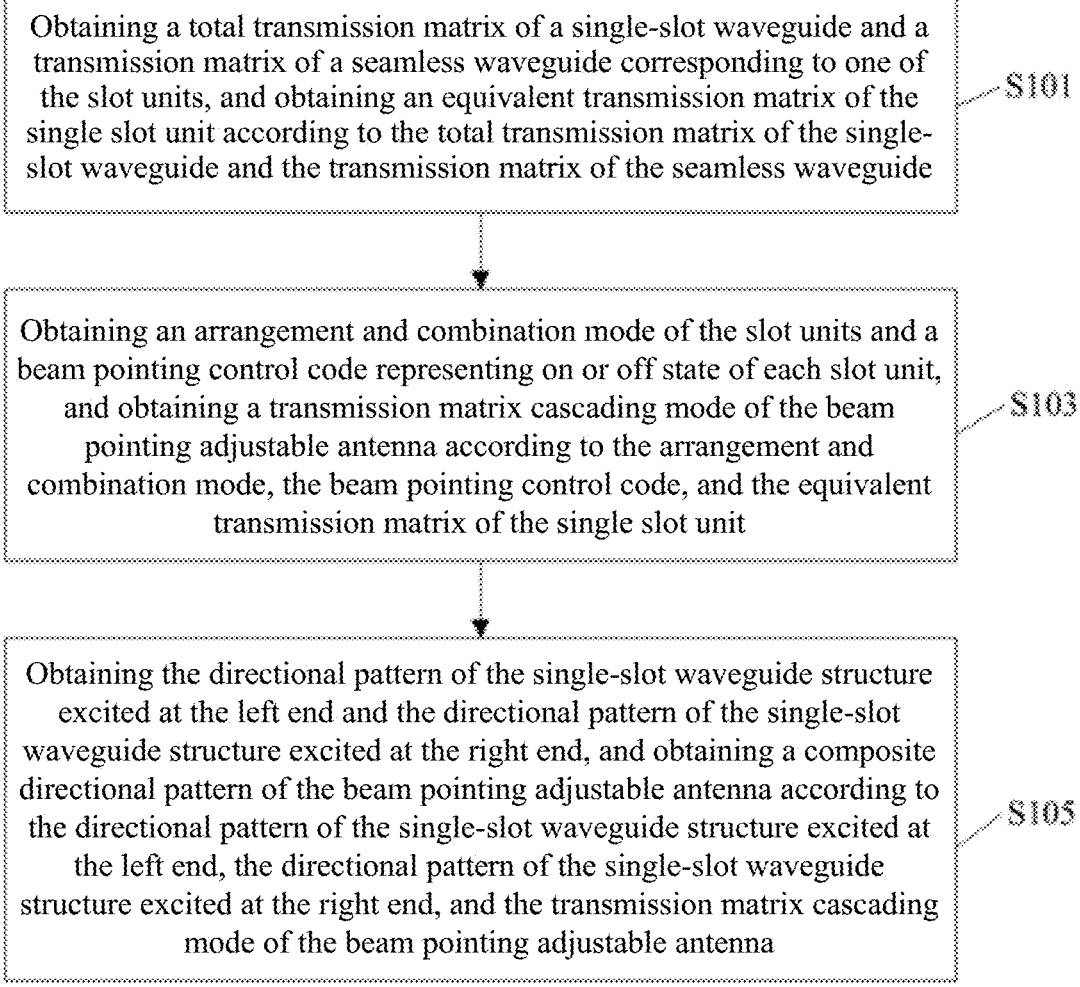
FIG. 1 is a flowchart of a method for calculating directional pattern of a beam pointing adjustable antenna according to an embodiment of the present disclosure.

As shown in FIG. 1, a method for calculating directional pattern of a beam pointing adjustable antenna according to an embodiment of the present disclosure includes the following steps:

S101. Obtaining a total transmission matrix of a single-slot waveguide and a transmission matrix of a seamless waveguide corresponding to one of the slot units, and obtaining an equivalent transmission matrix of the single slot unit according to the total transmission matrix of the single-slot waveguide and the transmission matrix of the seamless waveguide.

S103. Obtaining an arrangement and combination mode of the slot units and a beam pointing control code representing on or off state of each slot unit, and obtaining a transmission matrix cascading mode of the beam pointing adjustable antenna according to the arrangement and combination mode, the beam pointing control code, and the equivalent transmission matrix of the single slot unit.

S105. Obtaining the directional pattern of the single-slot waveguide structure excited at the left end and the directional pattern of the single-slot waveguide structure excited at the right end, and obtaining a composite directional pattern of the beam pointing adjustable antenna according to the directional pattern of the single-slot waveguide structure excited at the left end, the directional pattern of the single-slot waveguide structure excited at the right end, and the transmission matrix cascading mode of the beam pointing adjustable antenna.

Furthermore, various electrical performance indicators of the array antenna can be evaluated, such as: beam pointing angle, main lobe 3 dB beam width, a first null width, a side lobe level, a front-to-rear ratio, etc.

According to the foregoing technical solution in the present disclosure, it quantifies key control factors, for example, arrangement and combination mode of the slot units, a spacing between slot units, and beam pointing control code representing on and off states of the slot unit, and different combinations of slot units and a far-field directional pattern of a controlled array antenna are evaluated, so that electrical performance indicators of the array antenna can be further evaluated. Therefore, the weighted calculation of directional pattern of the beam pointing adjustable antenna is realized, and key information including a form of the slot unit and arrangement and combination mode of the slot units can be globally optimized. Which greatly saves the optimization of slot unit selection, arrangement, combination, and spacing during antenna design, so as to focus on structural form of the slot unit. In addition, according to the beam pointing and deflection requirement, the corresponding beam pointing control codes for on and off states of each slot unit may be further calculated, so as to provide guidance for the regulation of the beam pointing and achieve fast beam shaping and switching.

In one embodiment, obtaining the total transmission matrix of the single-slot waveguide corresponding to one of the slot units in step S101 includes the following steps: simulating the single-slot waveguide to obtain a total scattering parameter of the single-slot waveguide: and obtaining the total transmission matrix of the single-slot waveguide according to the total scattering parameter of the single-slot waveguide.

In one embodiment, obtaining the transmission matrix of the seamless waveguide in step S101 includes the following steps: obtaining a simulation model of the seamless waveguide: and performing electromagnetic simulation on the simulation model of the seamless waveguide to obtain the transmission matrix of the seamless waveguide.

In another embodiment, obtaining the transmission matrix of the seamless waveguide in step S1 includes the following steps: obtaining an equivalent transmission line model of the seamless waveguide: and performing calculation according to the equivalent transmission line model of the seamless waveguide and transmission line matrix theory to obtain the transmission matrix of the seamless waveguide.

In one embodiment, the arrangement and combination mode of the slot unit in step S103 includes a spacing between the slot units, a form of the slot unit, or a combination of them. Therefore, a combination of the slot units and a spacing between adjacent slot units can be globally optimized.

In one embodiment, step S105 may specifically include the following steps: obtaining an equivalent input-to-output ratio of the single slot unit according to a transmission matrix of the beam pointing adjustable antenna: obtaining the directional pattern of the single-slot waveguide excited at the left end and the directional pattern of the single-slot waveguide excited at the right end: and obtaining the composite directional pattern according to the directional pattern of the single-slot waveguide excited at the left end, the directional pattern of the single-slot waveguide excited at the right end, and the equivalent input-to-output ratio of the single slot unit.

Figure 2:
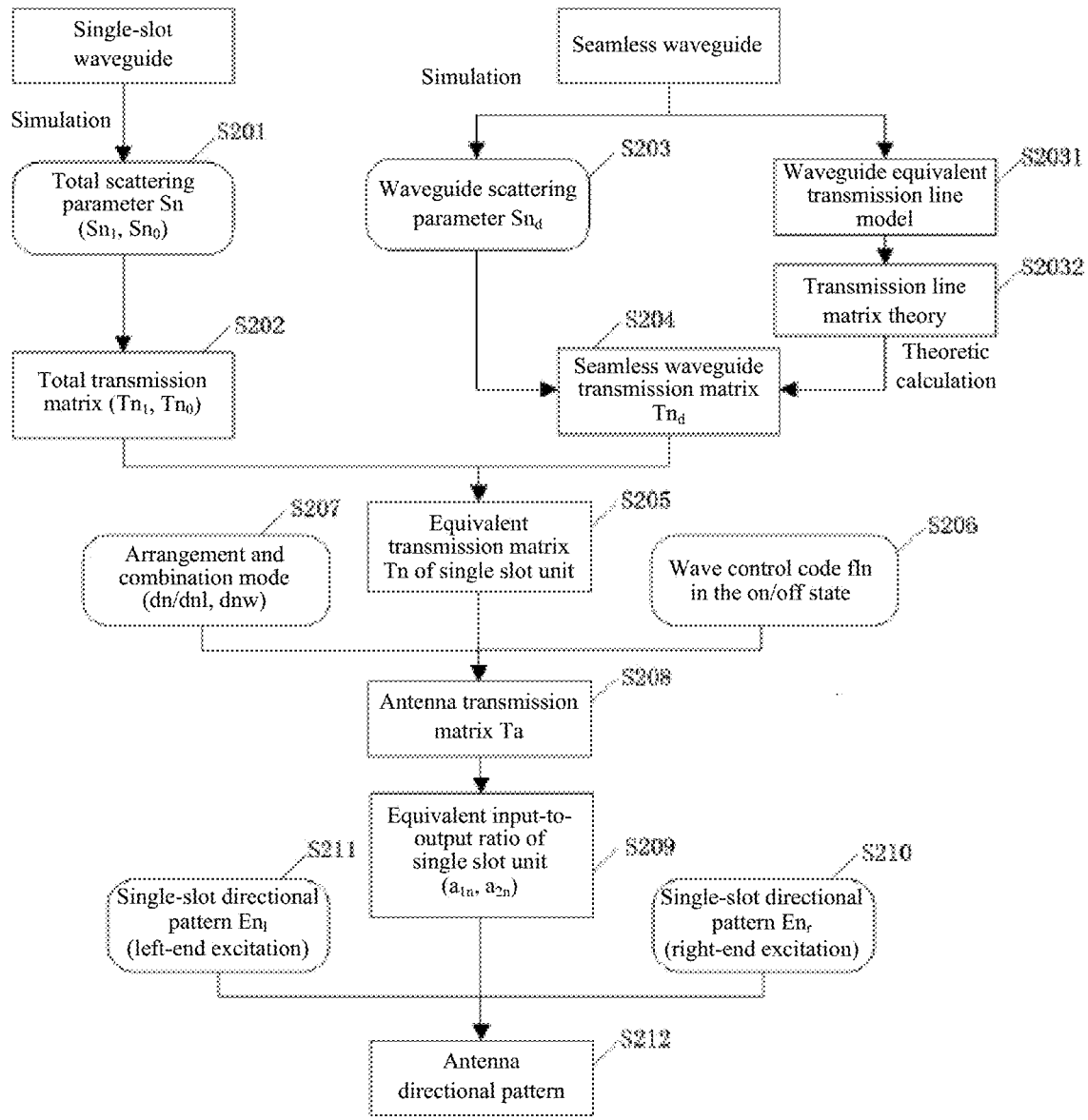
FIG. 2 is a flowchart of a method for calculating directional pattern of a beam pointing adjustable antenna according to a specific embodiment of the present disclosure.

FIG. 2 shows a method for calculating directional pattern of the beam pointing adjustable antenna according to a specific embodiment of the present disclosure. The method of FIG. 2 includes the following steps:

S201. Simulating a single-slot waveguide to obtain a total scattering parameter Sn of n single-slot waveguides, wherein the total scattering parameter Sn includes a scattering parameter $Sn_1$ of different slot units in the on state and a scattering parameter $Sn_0$ of different slot units in the off state. In other words, the scattering parameter $Sn=Sn_1$ of different slot units in the on state and the scattering parameter $Sn=Sn_0$ of different slot units in the off state are extracted by using the simulation method.

S202. Obtaining the total transmission matrix of the single-slot waveguide according to the total scattering parameter Sn of the single-slot waveguide. The total transmission matrix includes transmission matrixes $Tn_1$ and $Tn_0$. Wherein, the transmission matrix $Tn_1$ is obtained by conversion according to the scattering parameter $Sn_1$ in the on state. The transmission matrix $Tn_0$ is obtained by conversion according to the scattering parameter $Sn_0$ in the off state.

S203. Simulating the seamless waveguide to obtain the scattering parameter $Sn_d$ of the seamless waveguide.

S204. Obtaining the transmission matrix $Tn_d$ of the seamless waveguide according to the scattering parameter $Sn_d$ of the seamless waveguide.

S205. Obtaining an equivalent transmission matrix Ts of the slot unit according to the total transmission matrixes $Tn_1$ and $Tn_0$ of the single-slot waveguide and the transmission matrix $Tn_d$ of the seamless waveguide.

S206. Obtaining a beam pointing control code fln=1 indicating the on state of each slot unit or a beam pointing control code fln=0 indicating the off state of each slot unit.

S207. Obtaining an arrangement and combination mode of a plurality of slot units and a spacing between slot units (denoted as dn for a one-dimensional array, and denoted as $dn_1$ and $dn_w$ for a two-dimensional array respectively).

S208. According to the arrangement and combination mode and the beam pointing control code, simulating a transmission matrix Ta of the beam pointing adjustable antenna in the form of a transmission matrix cascading mode.

S209. Calculating the equivalent input-to-output ratio of the single slot unit according to the transmission matrix Ta of the beam pointing adjustable antenna, that is, an input proportion $a_{1n}$ at an input end 1 of the $n^{th}$ slot unit in a two-port equivalent network in a single-port and unit-excitation case, and an input proportion $a_{2n}$ at an output end 2.

S210. Obtaining right end excitation directional pattern data $En_r$ excited at the right end of the slot unit in the on and off states. The right end excitation directional pattern data $En_r$ includes right end excitation directional pattern data $En_{r1}$ in the on state and right end excitation directional pattern data $En_{r0}$ in the off state.

S211. Obtaining left end excitation directional pattern data $En_l$ excited at the left end of the slot unit in the on and off states. The left end excitation directional pattern data $En_l$ includes left end excitation directional pattern data $En_{l1}$ in the on state and left end excitation directional pattern data $En_{l0}$ in the off state.

S212. Performing weighted calculation on the directional pattern of the beam pointing adjustable antenna according to the right end excitation directional pattern data, the left end excitation directional pattern data, and the equivalent input-to-output ratio of the single slot unit.

Among them, the order of steps S206 and S207 can be interchanged or performed simultaneously, and the order of steps S210 and S211 can also be interchanged or performed simultaneously.

Optionally, as shown in FIG. 2, the transmission matrix Twg of the seamless waveguide can also be obtained through the following steps:

S2031. Obtaining an equivalent transmission line model of the seamless waveguide.

S2032. Performing calculation according to the equivalent transmission line model of the seamless waveguide and transmission line matrix theory, to obtain the transmission matrix of the seamless waveguide.

In the method for calculating directional pattern of a beam pointing adjustable antenna shown in FIG. 2, an input signal includes: the total scattering parameter Sn of the single-slot waveguides, the scattering parameter $Sn_d$ of the seamless waveguide, the arrangement and combination modes for the slot units, the wave-controlled codes, the right-port-excited directional pattern data, and the left-port-excited directional pattern data: and output is the directional pattern of the beam pointing adjustable antenna. The foregoing input information may be obtained by using a simulation method.

In an embodiment, the beam pointing adjustable antenna is in a one-dimensional or two-dimensional array structure. The method for calculating directional pattern of a beam pointing adjustable antenna in the present disclosure is applicable to a plurality of combinations of slot units, is applicable to both a one-dimensional array and a two-dimensional array, and therefore has relatively high value in engineering application.

The following compares the antenna directional pattern obtained according to the method for calculating directional pattern of a beam pointing adjustable antenna in the present disclosure with an antenna directional pattern obtained through simulation, to illustrate an effect of the method.

Figure 3:
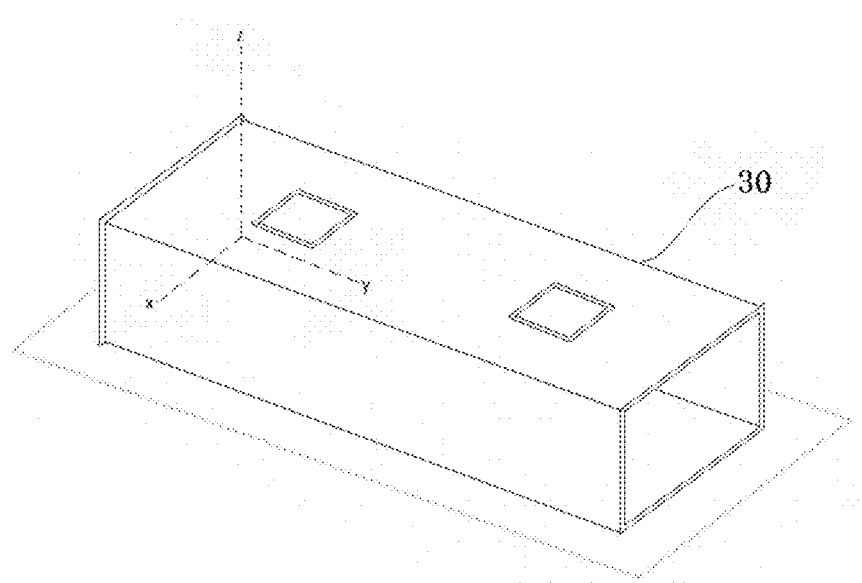
FIG. 3 is a schematic diagram of a dual-slot waveguide antenna.

FIG. 3 is a schematic diagram of a simple dual-slot waveguide antenna. An opening slot unit is formed at a wide-side opening of a standard rectangular waveguide 30. A structural form of the opening slot unit is a rectangle.

Figure 4:
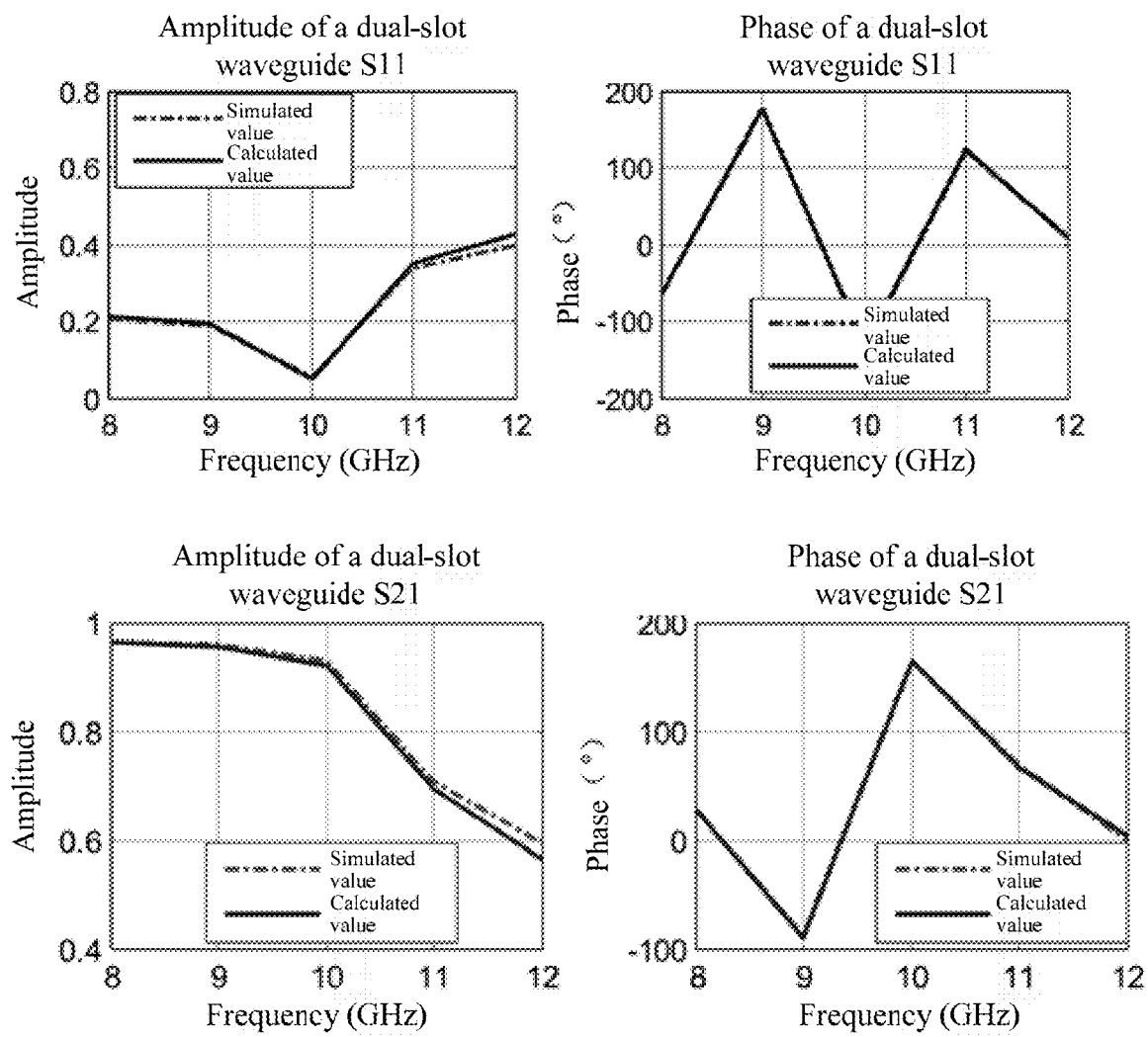
FIG. 4 is a schematic diagram of comparing an amplitude and a phase of dual-slot waveguide scattering parameters calculated in the present disclosure with a simulation result.

First, compare a calculated dual-slot waveguide scattering parameter with a dual-slot waveguide scattering parameter obtained through simulation. FIG. 4 is a schematic diagram of comparing an amplitude and a phase of calculated dual-slot waveguide scattering parameters S11 and S21 with a simulation result.

Figure 5:
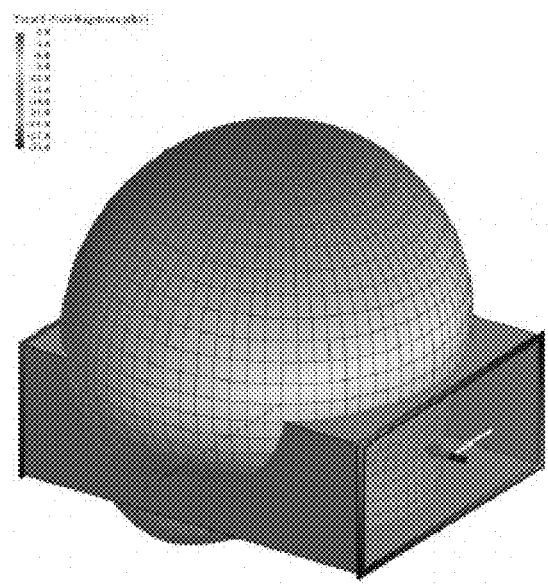
FIG. 5 (*a*) is a schematic diagram of a far-field simulation result of a simulated single-slot waveguide under left-port excitation.
Figure 5:
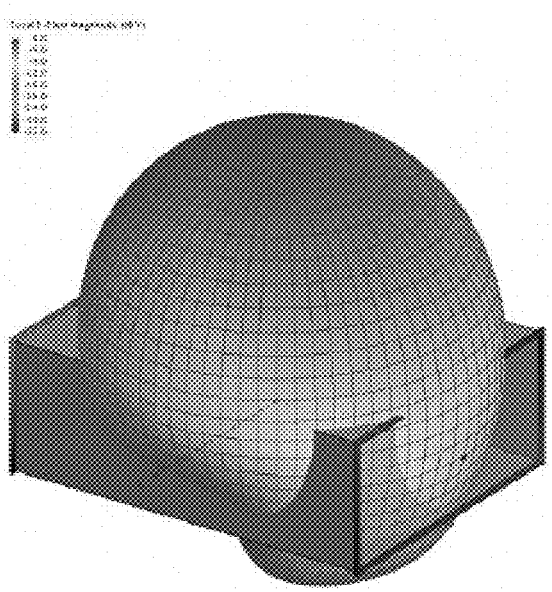
Figure 5:
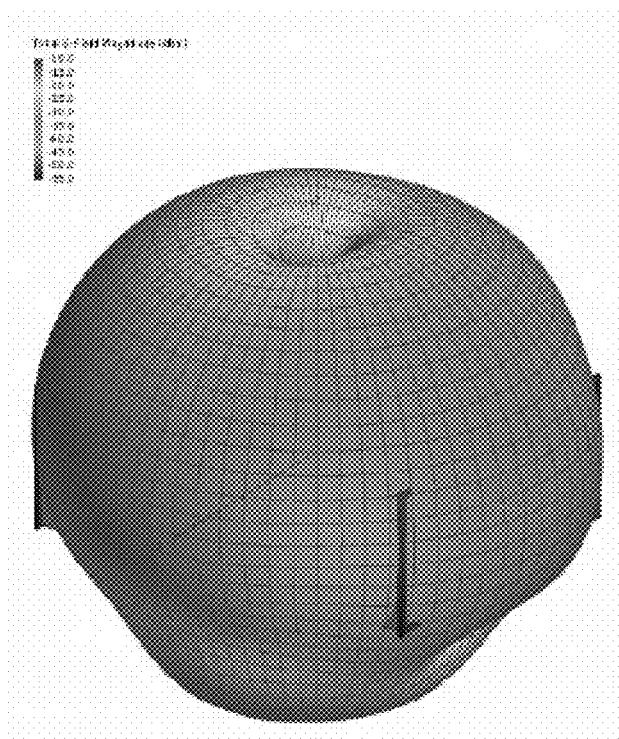
Figure 6:
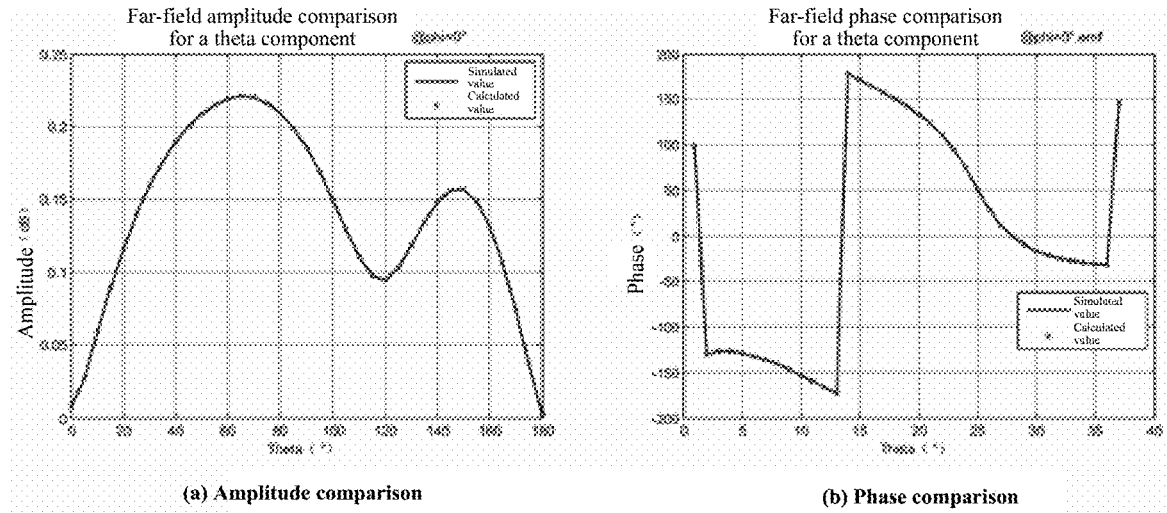
FIG. 6 (*a*) and FIG. 6 (*b*) are schematic diagrams of comparing a far-field amplitude and phase calculated in the present disclosure under dual-port excitation with a simulation result.

Next, verify calculation of a far-field directional pattern of a single-slot waveguide under single-port excitation and dual-port excitation. Far-field simulation results of the single-slot waveguide that are obtained through simulation under left-port excitation, right-port excitation, and dual-port excitation are shown in FIG. 5 (a), FIG. 5 (b), and FIG. 5 (c) respectively. FIG. 6 compares a far-field amplitude and phase calculated under dual-port excitation with a simulation result. It can be learned that the simulation result and the calculated values are highly consistent.

Figure 7:
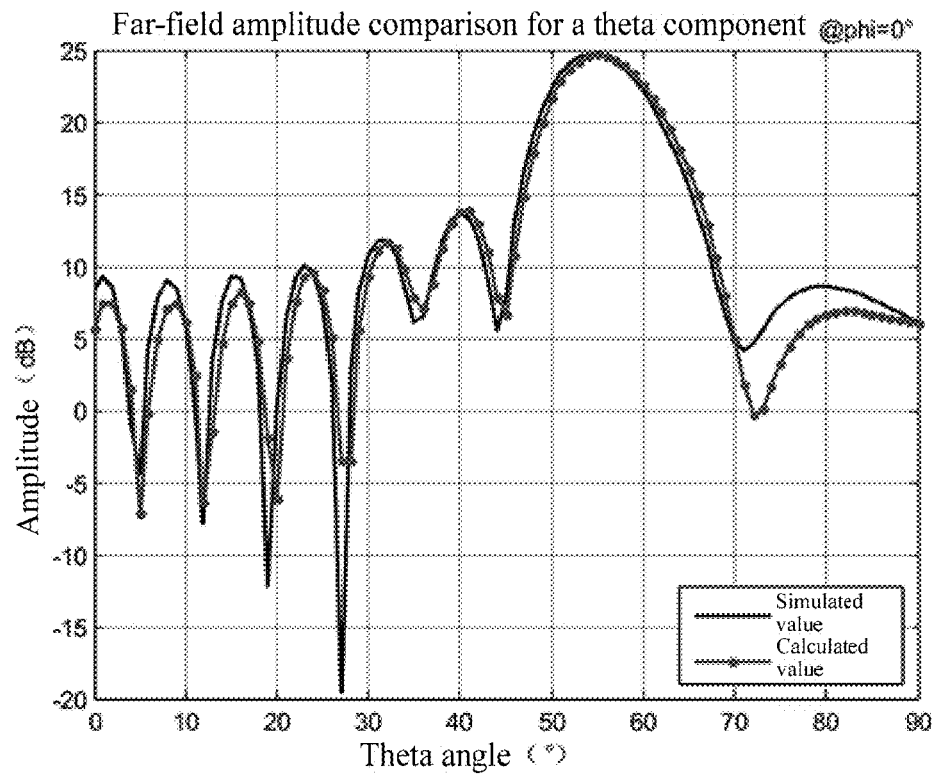
FIG. 7 is a schematic diagram of comparing a far-field result calculated in the present disclosure with a simulation result.

Finally, perform calculation on a multi-component one-dimensional array. FIG. 7 compares a far-field simulated value with a far-field calculated value. It can be learned from FIG. 7 that a simulation result and a calculated amplitude of a directional pattern are highly consistent. Beam deflection can be implemented by switching between slot codes of various slots, and an angle error of a deflection angle is less than 1°.

In summary, in the present disclosure, the method for calculating directional pattern of beam pointing adjustable antenna is quantized by key control factors, for example, arrangement and combination mode of n slot units, a spacing between slot units (denoted as dn for one-dimensional array, and denoted as $dn_1$ and $dn_w$ for two-dimensional array), beam pointing control code (fln=1) for on state of the slot unit, and beam pointing control code (fln=0)) for off state of the slot unit. The present disclosure evaluates far-field directional pattern of the array antenna controlled by different combination and adjustment of the slot units, and further evaluates the electrical performance indicators (for example, beam pointing angle, main-lobe beam width at 3 dB, first null width, side-lobe level, and front-to-rear ratio) of the array antenna. The scattering parameters in the on state (Sn=$Sn_1$) and the off state (Sn=$Sn_0$) of different slot units are extracted by simulation and other methods. The scattering parameter ($Sn_d$) is calculated with reference to the equivalent transmission line theory of the seamless waveguide of any length. After conversion, the transmission matrixes ($Tn_1$, $Tn_0$, and $Tn_d$) are obtained, and the equivalent transmission matrix (Tn) of the slot unit is extracted. And then according to information of different slot units, slot unit spacing, and beam pointing control code, the transmission matrix is cascaded to simulate the total transmission characteristic (Ta) of the beam pointing adjustable antenna. The present disclosure then calculates an input ratio $a_{1n}$ of an input end 1, an input ratio $a_{2n}$ of an output end 2 under a two-port equivalent network of the $n^{th}$ slot unit and under a single-port and single-unit excitation. The present disclosure then directly measure the directional pattern data based on the left end and right end of various slot units that are separately excited, on and off states of each slot unit ($En_1$ for left-end excitation includes $En_{11}$ and $En_{10}$, and $En_r$ for right-end excitation includes $En_{r1}$ and $En_{r0}$).

Therefore, operability is strong or high, and directional pattern of the beam pointing adjustable antenna is calculated without depending on simulation software. In addition, the weighted calculation of directional pattern of the beam pointing adjustable antenna is realized. Key information including a form of the slot unit and arrangement and combination mode of the slot units can be globally optimized. Which greatly saves the optimization of slot unit selection, arrangement, combination, and spacing during antenna design, so as to focus on structural form of the slot unit. In addition, according to the beam pointing and deflection requirement, the corresponding beam pointing control codes for on and off states of each slot unit may be further calculated, so as to provide guidance for the regulation of the beam pointing and achieve fast beam shaping and switching.

Figure 8:
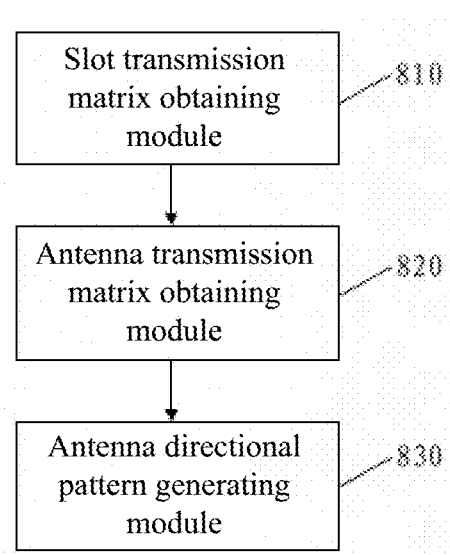
FIG. 8 is a schematic diagram of a directional pattern calculation apparatus for a beam pointing adjustable antenna according to an embodiment of the present disclosure.

As shown in FIG. 8, according to an embodiment of the present disclosure, a device for calculating directional pattern of the beam pointing adjustable antenna is further provided, the device includes the following sequentially connected modules:

a slot transmission matrix obtaining module 810, configured for: obtaining a total transmission matrix of a single-slot waveguide corresponding to one of the slot units and a transmission matrix of a seamless waveguide, and obtaining an equivalent transmission matrix of the single slot unit according to the total transmission matrix of the single-slot waveguide and the transmission matrix of the seamless waveguide;

an antenna transmission matrix obtaining module 320, configured for: obtaining an arrangement and combination mode of the slot units and a beam pointing control code representing on or off state of each slot unit, and obtaining a transmission matrix cascading mode of the beam pointing adjustable antenna according to the arrangement and combination mode, the beam pointing control code, and an equivalent scattering parameter matrix of the single slot unit; and an antenna directional pattern generating module 330, configured for: obtaining the directional pattern of the single-slot waveguide excited at the left end and the directional pattern of the single-slot waveguide excited at the right end, and obtaining a composite directional pattern of the beam pointing adjustable antenna according to the directional pattern of the single-slot waveguide excited at the left end, the directional pattern of the single-slot waveguide excited at the right end, and the transmission matrix cascading mode of the beam pointing adjustable antenna.

In one embodiment, the slot transmission matrix obtaining module 310 includes: a single-slot waveguide measurement submodule 312, configured for: performing a two-port test on the single-slot waveguide to obtain the scattering parameter matrix of the single-slot waveguide.

In one embodiment, the slot transmission matrix obtaining module 310 includes the following sequentially connected submodules: a seamless waveguide transmission model obtaining submodule (not shown) configured for: obtaining an equivalent transmission line model of the seamless waveguide: and a seamless waveguide transmission matrix obtaining submodule (not shown) configured for: performing calculation according to the equivalent transmission line model of the seamless waveguide and transmission line matrix theory, to obtain the transmission matrix of the seamless waveguide.

In an embodiment, the antenna directional pattern generating module 330 includes the following sequentially connected submodules: a slot unit equivalent input-output ratio obtaining submodule configured for: obtaining an equivalent input-to-output ratio of a single slot unit according to a transmission matrix of the beam pointing adjustable antenna: a single-slot waveguide directional pattern obtaining submodule configured for: obtaining the directional pattern of the single-slot waveguide excited at the left end and the directional pattern of the single-slot waveguide excited at the right end: and an antenna directional pattern generating submodule configured for: obtaining the composite directional pattern according to the directional pattern of the single-slot waveguide excited at the left end, the directional pattern of the single-slot waveguide excited at the right end, and the equivalent input-to-output ratio of the single slot unit.

In one embodiment, the beam pointing adjustable antenna is a one-dimensional or two-dimensional array structure.

As shown in FIG. 8, according to an embodiment of the present disclosure, a directional pattern calculation apparatus for a beam pointing adjustable antenna is further provided, including the following sequentially connected modules:

a slot transmission matrix obtaining module 810, configured for: obtaining a total transmission matrix of a single-slot waveguide and a transmission matrix of a seamless waveguide corresponding to one of the slot units, and obtaining an equivalent transmission matrix of the single slot unit according to the total transmission matrix of the single-slot waveguide and the transmission matrix of the seamless waveguide:

an antenna transmission matrix obtaining module 820, configured for: obtaining an arrangement and combination mode of the slot units and a beam pointing control code representing on or off state of each slot unit, and obtaining a transmission matrix cascading mode of the beam pointing adjustable antenna according to the arrangement and combination mode, the beam pointing control code, and the equivalent transmission matrix of the single slot unit; and an antenna directional pattern generating module 830, configured for: obtaining the directional pattern of the single-slot waveguide structure excited at the left end and the directional pattern of the single-slot waveguide structure excited at the right end, and obtaining a composite directional pattern of the beam pointing adjustable antenna according to the directional pattern of the single-slot waveguide structure excited at the left end, the directional pattern of the single-slot waveguide structure excited at the right end, and the transmission matrix cascading mode of the beam pointing adjustable antenna.

According to an embodiment of the present disclosure, the slot transmission matrix obtaining module 810 includes the following sequentially connected submodules: a single-slot waveguide simulating submodule configured for: simulating the single-slot waveguide to obtain a total scattering parameter of the single-slot waveguide: and a single-slot waveguide transmission matrix obtaining submodule configured for: obtaining the total transmission matrix of the single-slot waveguide according to the total scattering parameter of the single-slot waveguide.

In one embodiment, the slot transmission matrix obtaining module 810 comprises following sequentially connected submodules: a seamless waveguide simulating submodule configured for: obtaining a simulation model of the seamless waveguide: and a first seamless waveguide transmission matrix obtaining submodule configured for: performing electromagnetic simulation on the simulation model of the seamless waveguide to obtain the transmission matrix of the seamless waveguide.

In another embodiment, the slot transmission matrix obtaining module 810 includes the following sequentially connected submodules: a seamless waveguide equivalence submodule configured for: obtaining an equivalent transmission line model of the seamless waveguide: and a second seamless waveguide transmission matrix obtaining submodule configured for: performing calculation according to the equivalent transmission line model of the seamless waveguide and transmission line matrix theory to obtain the transmission matrix of the seamless waveguide.

In an embodiment, the antenna directional pattern generating module 830 includes the following sequentially connected submodules: an equivalent input to output ratio obtaining submodule, configured for:obtaining an equivalent input-to-output ratio of the single slot unit according to a transmission matrix of the beam pointing adjustable antenna:

a single-slot waveguide directional pattern obtaining submodule configured for: obtaining the directional pattern of the single-slot waveguide excited at the left end and the directional pattern of the single-slot waveguide excited at the right end; and an antenna directional pattern generating submodule, configured for: obtaining the composite directional pattern according to the directional pattern of the single-slot waveguide excited at the left end, the directional pattern of the single-slot waveguide excited at the right end, and the equivalent input-to-output ratio of the single slot unit.

In an embodiment, the beam pointing adjustable antenna is a one-dimensional or two-dimensional array structure.

The foregoing are merely preferred embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A method for calculating directional pattern of a beam pointing adjustable antenna, the beam pointing adjustable antenna comprising a plurality of slot units that generate leaky waves, and the method comprising the following steps:

S1. obtaining a total transmission matrix of a single-slot waveguide corresponding to one of the slot units and a transmission matrix of a seamless waveguide corresponding to the slot unit, and obtaining an equivalent transmission matrix of the single slot unit according to the total transmission matrix of the single-slot waveguide and the transmission matrix of the seamless waveguide;

S2. obtaining an arrangement and combination mode of the slot units and a beam pointing control code representing on or off state of each slot unit, and obtaining a transmission matrix cascading mode of the beam pointing adjustable antenna according to the arrangement and combination mode, the beam pointing control code, and the equivalent transmission matrix of the single slot unit; and S3. obtaining the directional pattern of the single-slot waveguide structure excited at the left end and the directional pattern of the single-slot waveguide structure excited at the right end, and obtaining a composite directional pattern of the beam pointing adjustable antenna according to the directional pattern of the single-slot waveguide structure excited at the left end, the directional pattern of the single-slot waveguide structure excited at the right end, and the transmission matrix cascading mode of the beam pointing adjustable antenna.

2. The method for calculating directional pattern of the beam pointing adjustable antenna according to claim 1, wherein the arrangement and combination mode of the slot unit in step S2 comprises a spacing between the slot units, a form of the slot unit, or a combination of them.

3. The method for calculating directional pattern of the beam pointing adjustable antenna according to claim 1, wherein obtaining the total transmission matrix of the single-slot waveguide corresponding to one of the slot units in step S1 comprises:

simulating the single-slot waveguide to obtain a total scattering parameter of the single-slot waveguide; and obtaining the total transmission matrix of the single-slot waveguide according to the total scattering parameter of the single-slot waveguide.

4. The method for calculating directional pattern of the beam pointing adjustable antenna according to claim 1, wherein obtaining the transmission matrix of the seamless waveguide in step S1 comprises:

obtaining a simulation model of the seamless waveguide; and performing electromagnetic simulation on the simulation model of the seamless waveguide to obtain the transmission matrix of the seamless waveguide; or obtaining the transmission matrix of the seamless waveguide in step S1 comprises:

obtaining an equivalent transmission line model of the seamless waveguide; and performing calculation according to the equivalent transmission line model of the seamless waveguide and transmission line matrix theory to obtain the transmission matrix of the seamless waveguide.

5. The method for calculating directional pattern of the beam pointing adjustable antenna according to claim 1, wherein the step S3 comprises:

obtaining an equivalent input-to-output ratio of the single slot unit according to a transmission matrix of the beam pointing adjustable antenna;

obtaining the directional pattern of the single-slot waveguide excited at the left end and the directional pattern of the single-slot waveguide excited at the right end; and obtaining the composite directional pattern according to the directional pattern of the single-slot waveguide excited at the left end, the directional pattern of the single-slot waveguide excited at the right end, and the equivalent input-to-output ratio of the single slot unit.

6. The method for calculating directional pattern of the beam pointing adjustable antenna according to claim 1, wherein the beam pointing adjustable antenna is a one-dimensional or two-dimensional array structure.

7. A device for calculating directional pattern of a beam pointing adjustable antenna, comprising:

a slot transmission matrix obtaining module configured for: obtaining a total transmission matrix of a single-slot waveguide corresponding to one of the slot units and a transmission matrix of a seamless waveguide corresponding to the slot unit, and obtaining an equivalent transmission matrix of the single slot unit according to the total transmission matrix of the single-slot waveguide and the transmission matrix of the seamless waveguide;

an antenna transmission matrix obtaining module configured for: obtaining an arrangement and combination mode of the slot units and a beam pointing control code representing on or off state of each slot unit, and obtaining a transmission matrix cascading mode of the beam pointing adjustable antenna according to the arrangement and combination mode, the beam pointing control code, and the equivalent transmission matrix of the single slot unit; and an antenna directional pattern generating module, configured for: obtaining the directional pattern of the single-slot waveguide structure excited at the left end and the directional pattern of the single-slot waveguide structure excited at the right end, and obtaining a composite directional pattern of the beam pointing adjustable antenna according to the directional pattern of the single-slot waveguide structure excited at the left end, the directional pattern of the single-slot waveguide structure excited at the right end, and the transmission matrix cascading mode of the beam pointing adjustable antenna;

wherein the slot transmission matrix obtaining module, the antenna transmission matrix obtaining module, and the antenna directional pattern generating module are sequentially connected.

8. The device for calculating directional pattern of the beam pointing adjustable antenna according to claim 7, wherein the slot transmission matrix obtaining module comprises:

a single-slot waveguide simulating submodule configured for: simulating the single-slot waveguide to obtain a total scattering parameter of the single-slot waveguide; and a single-slot waveguide transmission matrix obtaining submodule configured for: obtaining the total transmission matrix of the single-slot waveguide according to the total scattering parameter of the single-slot waveguide;

wherein the single-slot waveguide simulating submodule and the single-slot waveguide transmission matrix obtaining submodule are sequentially connected.

9. The device for calculating directional pattern of the beam pointing adjustable antenna according to claim 7, wherein the slot transmission matrix obtaining module comprises following sequentially connected submodules:

a seamless waveguide simulating submodule configured for: obtaining a simulation model of the seamless waveguide; and a first seamless waveguide transmission matrix obtaining submodule configured for: performing electromagnetic simulation on the simulation model of the seamless waveguide to obtain the transmission matrix of the seamless waveguide; or the slot transmission matrix obtaining module comprises following sequentially connected submodules:

a seamless waveguide equivalence submodule configured for: obtaining an equivalent transmission line model of the seamless waveguide; and a second seamless waveguide transmission matrix obtaining submodule configured for: performing calculation according to the equivalent transmission line model of the seamless waveguide and transmission line matrix theory to obtain the transmission matrix of the seamless waveguide.

10. The device for calculating directional pattern of the beam pointing adjustable antenna according to claim 7, wherein the antenna directional pattern generating module comprises following sequentially connected submodules:

an equivalent input to output ratio obtaining submodule configured for: obtaining an equivalent input-to-output ratio of the single slot unit according to a transmission matrix of the beam pointing adjustable antenna;

a single-slot waveguide directional pattern obtaining submodule configured for: obtaining the directional pattern of the single-slot waveguide excited at the left end and the directional pattern of the single-slot waveguide excited at the right end; and an antenna directional pattern generating submodule configured for: obtaining the composite directional pattern according to the directional pattern of the single-slot waveguide excited at the left end, the directional pattern of the single-slot waveguide excited at the right end, and the equivalent input-to-output ratio of the single slot unit.

11. The device for calculating directional pattern of the beam pointing adjustable antenna according to claim 7, wherein the arrangement and combination mode of the slot unit comprises a spacing between the slot units, a form of the slot unit, or a combination of them.

12. The device for calculating directional pattern of the beam pointing adjustable antenna according to claim 7, wherein the beam pointing adjustable antenna is a one-dimensional or two-dimensional array structure.

13. The device for calculating directional pattern of the beam pointing adjustable antenna according to claim 7, a structural form of the slot unit is a rectangle opening.

14. The device for calculating directional pattern of the beam pointing adjustable antenna according to claim 7, a structural form of the slot unit is a rectangle opening.

* * * * *